(12) United States Patent
Takai et al.

(10) Patent No.: US 8,063,156 B2
(45) Date of Patent: Nov. 22, 2011

(54) COMPOSITION CONTAINING CYCLOALIPHATIC EPOXIDE, POLYOL OLIGOMER, AND CURING CATALYST

(75) Inventors: Hideyuki Takai, Otake (JP); Hiroyuki Hirakawa, Otake (JP)

(73) Assignee: Daicel Chemical Industries, Ltd., Osaka (JP)

( * ) Notice: Subject to any disclaimer, the term of this patent is extended or adjusted under 35 U.S.C. 154(b) by 0 days.

(21) Appl. No.: 12/894,905

(22) Filed: Sep. 30, 2010

(65) Prior Publication Data

US 2011/0021722 A1 Jan. 27, 2011

Related U.S. Application Data

(62) Division of application No. 11/667,549, filed as application No. PCT/JP2005/022668 on Dec. 9, 2005, now Pat. No. 7,825,197.

(30) Foreign Application Priority Data

Dec. 16, 2004 (JP) ................................. 2004-365145

(51) Int. Cl.
*C08L 63/00* (2006.01)
*C08L 63/02* (2006.01)
*C08L 63/04* (2006.01)
*C08L 63/06* (2006.01)
*C08L 67/02* (2006.01)
*C08L 69/00* (2006.01)
*H01L 23/29* (2006.01)

(52) U.S. Cl. .................. 525/463; 257/793; 525/438

(58) Field of Classification Search ................. None
See application file for complete search history.

(56) References Cited

U.S. PATENT DOCUMENTS

| | | | |
|---|---|---|---|
| 5,641,840 | A | 6/1997 | Tsuchida et al. |
| 5,985,510 | A | 11/1999 | Akutsu et al. |
| 6,486,235 | B2 | 11/2002 | Cooray et al. |
| 7,825,197 | B2 * | 11/2010 | Takai et al. ................... 525/438 |
| 2002/0037976 | A1 | 3/2002 | Nomiyama et al. |
| 2004/0242839 | A1 | 12/2004 | Takai |
| 2005/0037207 | A1 | 2/2005 | Komiyama |

FOREIGN PATENT DOCUMENTS

| | | |
|---|---|---|
| EP | 1172393 A1 | 1/2002 |
| JP | 55-147524 A | 11/1980 |
| JP | 6-298900 A | 10/1994 |
| JP | 8-311168 A | 11/1996 |
| JP | 9-71636 A | 3/1997 |
| JP | 9-255764 A | 9/1997 |
| JP | 10-156952 A | 6/1998 |
| JP | 2000-63485 A | 2/2000 |
| JP | 2000-204108 A | 7/2000 |
| JP | 2001-11416 A * | 1/2001 |
| JP | 2001-11416 A | 1/2001 |
| JP | 2001-166127 A * | 6/2001 |
| JP | 2001-166127 A | 6/2001 |
| JP | 2002-212396 A | 7/2002 |
| JP | 2004-203943 A * | 7/2004 |
| JP | 2004-203943 A | 7/2004 |
| WO | WO 00/42115 A1 | 7/2000 |

OTHER PUBLICATIONS

Database WPI, Week 200455; JP 2004-564328; XP002558493 & JP 2004 203943 A; Jul. 22, 2004; abstract.
Database WPI; Week 200124; JP 2001-229333—XP002558494 & JP 2001-011416 A1; Jan. 16, 2001, abstract.
European Search Report for Counterpart European Patent Application No. EP09013416.4 dated Jan. 18, 2010.
International Search Report mailed Feb. 14, 2006, for International Application No. PCT/JP2005/022668.

* cited by examiner

*Primary Examiner* — Robert Sellers
(74) *Attorney, Agent, or Firm* — Birch, Stewart, Kolasch & Birch, LLP

(57) ABSTRACT

A liquid thermosetting epoxy resin composition contains a base resin in combination with a curing agent and a curing accelerator or with a curing catalyst. The base resin includes a cycloaliphatic epoxy compound having at least one alicyclic skeleton and two or more epoxy groups per molecule, and a polyol oligomer having two or more terminal hydroxyl groups. An optical semiconductor device includes an optical semiconductor element sealed by using the liquid thermosetting epoxy resin composition. The composition yields a cured resinous product which is free from curing failure, is optically homogenous, has a low elastic modulus in bending, a high bending strength, a high glass transition temperature, a high optical transparency and is useful for optical semiconductors.

10 Claims, No Drawings

COMPOSITION CONTAINING CYCLOALIPHATIC EPOXIDE, POLYOL OLIGOMER, AND CURING CATALYST

This application is a Divisional of application Ser. No. 11/667,549 filed on May 11, 2007, which issued as U.S. Pat. No. 7,825,197 on Nov. 2, 2010, which is a National Phase of PCT International Application No. PCT/JP05/22668 filed on Dec. 9, 2005, which claims priority to Japanese Patent Application No. 2004-365145 filed in Japan on Dec. 16, 2004. The entire contents of all of the above applications are hereby incorporated by reference.

TECHNICAL FIELD

The present invention relates to epoxy resin compositions and cured resinous products. More specifically, it relates to liquid thermosetting epoxy resin compositions which can be cured by heating and can yield cured articles having an improved bending strength without decreasing optical transparency; cured resinous products; and use of them for the sealing of optical semiconductors.

BACKGROUND ART

Liquid epoxy compounds containing an alicyclic skeleton and having satisfactory optical transparency and high heat resistance are frequently used in epoxy resin compositions for sealing optical semiconductor elements. Examples of these epoxy compounds are CELLOXIDE 2021 (3,4-epoxycyclohexylmethyl-3',4'-epoxycyclohexanecarboxylate), CELLOXIDE 2081 (an adduct between 3,4-epoxycyclohexylmethyl-3',4'-epoxycyclohexanecarboxylate and ε-caprolactone dimer), and CELLOXIDE 3000 (1,2,8,9-diepoxylimonene), each available from Daicel Chemical Industries, Ltd.

Epoxy compounds having a 3,4-epoxycyclohexylmethyl-3',4'-epoxycyclohexanecarboxylate structure typified by CELLXIDE 2021 yield cured products excellent in heat resistance and optical transparency and are used in resins for sealing optical semiconductors such as LED. These cycloaliphatic epoxy compounds such as CELLOXIDE 2021, however, are insufficient in heat-cycle resistance and invite cracking to thereby decrease the reliability of product electronic parts.

Conventional proposals for improving physical properties of epoxy resins, such as for increasing impact resistance and preventing cracking, are as follows. Japanese Unexamined Patent Application Publication (JP-A) No. 09-255764, for example, discloses an epoxy resin composition for sealing optical semiconductors, containing a diglycidyl ether of hydrogenated bisphenol-A. JP-A No. 10-156952 discloses a stereolithographic resin composition using a cycloaliphatic epoxy compound as in the present invention. JP-A No. 2000-63485 discloses a curable composition for buildup, containing a specific cycloaliphatic epoxy compound and a polyepoxy compound having a polyphenol skeleton. JP-A No. 09-71636 discloses an active energy ray-curable composition using a cycloaliphatic epoxy compound as in the present invention.

Patent Document 1: Japanese Unexamined Patent Application Publication (JP-A) No. 09-255764
Patent Document 2: Japanese Unexamined Patent Application Publication (JP-A) No. 10-156952
Patent Document 3: Japanese Unexamined Patent Application Publication (JP-A) No. 2000-63485
Patent Document 4: Japanese Unexamined Patent Application Publication (JP-A) No. 09-71636

DISCLOSURE OF INVENTION

Problems to be Solved by the Invention

A cured product of the epoxy resin composition for sealing optical semiconductors disclosed in JP-A No. 09-255764 is insufficient typically in coloring, weather resistance, and heat resistance. JP-A No. 10-156952 fails to describe the use of the resin composition for sealing optical semiconductors. The curable composition for buildup described in JP-A No. 2000-63485 does not find its features in heat resistance and optical transparency. The active energy ray-curable composition described in JP-A No. 09-71636 is cured by using active energy rays and may thereby cause partial curing failure and fail to yield an optically homogenous cured product in the production of a thick cured product. In addition, the resulting thick cured product has a woven or burnt surface and is insufficiently cured in a deep part and underexposed portions.

Means for Solving the Problems

The present inventors have found that the heat-cycle resistance can be improved by improving elastic properties of cycloaliphatic epoxy resins. They have also found that, by incorporating a cycloaliphatic epoxy resin and a specific polyol, the resulting thermosetting epoxy resin compositions for sealing optical semiconductors can yield optically homogenous cured products that are free from curing failure and have heat-cycle resistance while maintaining their good optical transparency and high heat resistance. The present invention has been achieved based on these findings.

Specifically, according to a first embodiment of the present invention, the present invention provides liquid thermosetting epoxy resin composition containing a base resin, a curing agent (C), and a curing accelerator (D), which base resin contains a cycloaliphatic epoxy compound (A) having at least one alicyclic skeleton and two or more epoxy groups per molecule, and a polyol oligomer (B) having two or more terminal hydroxyl groups.

According to a second embodiment of the present invention, the present invention further provides a liquid thermosetting epoxy resin composition containing a base resin and a curing catalyst (C'), which base resin contains a cycloaliphatic epoxy compound (A) having at least one alicyclic skeleton and two or more epoxy groups per molecule, and a polyol oligomer (B) having two or more terminal hydroxyl groups.

There is also provided, according to a third embodiment of the present invention, the liquid thermosetting epoxy resin composition according to first or second embodiment, wherein the cycloaliphatic epoxy compound (A) is a liquid cycloaliphatic epoxy compound.

There is also provided, according to a fourth embodiment of the present invention, the liquid thermosetting epoxy resin composition according to first or second embodiment, wherein the polyol oligomer (B) is a liquid polyol oligomer.

There is also provided, according to a fifth embodiment of the present invention, the liquid thermosetting epoxy resin composition according to first or second embodiment, wherein the polyol oligomer (B) is a liquid polyol oligomer (B-1) having at least one ester skeleton and two or more terminal hydroxyl groups per molecule.

There is also provided, according to a sixth embodiment of the present invention, the liquid thermosetting epoxy resin composition according to the first embodiment containing 100 parts by weight of a base resin, 50 to 150 parts by weight of the curing agent (C), and 0.05 to 5 parts by weight of the curing accelerator (D), which 100 parts by weight of the base resin includes 95 to 50 parts by weight of the cycloaliphatic epoxy compound (A) and 5 to 50 parts by weight of the liquid polyol oligomer (B-1).

There is also provided, according to a seventh embodiment of the present invention, the liquid thermosetting epoxy resin composition according to the second embodiment containing 100 parts by weight of the base resin and 0.01 to 15 parts by weight of the curing catalyst (C'), which 100 parts by weight of the base resin includes 95 to 50 parts by weight of the cycloaliphatic epoxy compound (A) and 5 to 50 parts by weight of the liquid polyol oligomer (B-1).

There is also provided, according to a eighth embodiment of the present invention, the liquid thermosetting epoxy resin composition according to first or second embodiment, wherein the polyol oligomer (B) is a liquid polyol oligomer (B-2) having at least one carbonate skeleton and two or more terminal hydroxyl groups per molecule.

There is also provided, according to a ninth embodiment of the present invention, the liquid thermosetting epoxy resin composition according to the first embodiment containing 100 parts by weight of the base resin, 50 to 150 parts by weight of the curing agent (C), an 0.05 to 5 parts by weight of the curing accelerator (D), which 100 parts by weight of the base resin includes 95 to 50 parts by weight of the cycloaliphatic epoxy compound (A) and 5 to 50 parts by weight of the liquid polyol oligomer (B-2).

There is also provided, according to a tenth embodiment of the present invention, the liquid thermosetting epoxy resin composition according to the second embodiment containing 100 parts by weight of the base resin and 0.01 to 15 parts by weight of the curing catalyst (C'), which 100 parts by weight of the base resin includes 95 to 50 parts by weight of the cycloaliphatic epoxy compound (A) and 5 to 50 parts by weight of the liquid polyol oligomer (B-2).

There is also provided, according to a eleventh embodiment of the present invention, the liquid thermosetting epoxy resin composition according to any one of the eighth, ninth, and tenth embodiments, wherein the liquid polyol oligomer (B-2) is a liquid polyol oligomer derived from a mixture of two or more different polyols.

There is also provided, according to a twelfth embodiment of the present invention, the liquid thermosetting epoxy resin composition according to the ninth embodiment, wherein the liquid polyol oligomer (B-2) is a carbonate polyol derived from 1,6-hexanediol, another diol component represented by HO—R—OH, wherein R represents a linear or branched hydrocarbon group containing two to fourteen carbon atoms which may contain oxygen or a hydrocarbon group containing two to fourteen carbon atoms and having one to three cyclic structures which may contain oxygen in its ring, and a carbonate component, which carbonate polyol has a molar ratio of 1,6-hexanediol to the other diol component of 10:1 to 2:8 and a number-average molecular weight of 300 to 3000.

There is also provided, according to a thirteenth embodiment of the present invention, the liquid thermosetting epoxy resin composition according to the tenth embodiment, wherein the liquid polyol oligomer (B-2) is a carbonate polyol including 1,6-hexanediol, another diol component represented by HO—R—OH, wherein R represents a linear or branched hydrocarbon group containing two to fourteen carbon atoms which may contain oxygen or a hydrocarbon group containing two to fourteen carbon atoms and having one to three cyclic structures which may contain oxygen in its ring, and a carbonate component, which carbonate polyol has a molar ratio of 1,6-hexanediol to the other diol component of 10:1 to 2:8 and a number-average molecular weight of 300 to 3000.

There is also provided, according to a fourteenth embodiment of the present invention, the liquid thermosetting epoxy resin composition according to any one of the seventh, tenth, and thirteenth embodiments, wherein the curing catalyst (C') is an initiator capable of releasing a substance for initiating cationic polymerization as a result of heating.

There is also provided, according to a fifteenth embodiment of the present invention, the liquid thermosetting epoxy resin composition according to any one of the sixth, ninth, and twelfth embodiments, wherein the curing agent (C) is a liquid acid anhydride.

There is also provided, according to a sixteenth embodiment of the present invention, the liquid thermosetting epoxy resin composition according to any one of the first, second, third, fourth, fifth, sixth, seventh, eighth, ninth, tenth, eleventh, twelfth, thirteenth, fourteenth and fifteenth embodiments, for sealing of optical semiconductors.

There is also provided, according to a seventeenth embodiment of the present invention, a liquid epoxy resin composition containing a cycloaliphatic epoxy compound (A) having at least one alicyclic skeleton and two or more epoxy groups per molecule, and a polyol oligomer (B) having two or more terminal hydroxyl groups.

There is also provided, according to a eighteenth embodiment of the present invention, the liquid epoxy resin composition according to the seventeenth embodiment for sealing optical semiconductors.

There is also provided, according to a nineteenth embodiment of the present invention, a cured resinous product derived from a liquid thermosetting epoxy resin composition, the cured resinous product having a transmittance to light at a wavelength of 380 nm of 70 T % or more, a transmittance to light at a wavelength of 400 nm of 78 T % or more, a bending strength of 50 MPa or more, and an elastic modulus in bending of 1700 to 2800 MPa.

There is also provided, according to a twentieth embodiment of the present invention, the cured resinous product according to the nineteenth embodiment, comprising a moiety derived from a cycloaliphatic epoxy compound having at least one alicyclic skeleton and two or more epoxy groups per molecule, and a moiety derived from a polyol oligomer having two or more terminal hydroxyl groups.

There is also provided, according to a twenty-first embodiment of the present invention, a cured resinous product derived from any one of the liquid thermosetting epoxy resin compositions according to the first, second, third, fourth, fifth, sixth, seventh, eighth, ninth, tenth, eleventh, twelfth, thirteenth, fourteenth, fifteenth, sixteenth, seventeenth and eighteenth embodiments.

There is also provided, according to a twenty-second embodiment of the present invention, the cured resinous product according to any one of the nineteenth, twentieth and twenty-first embodiments, which is optically homogenous.

In addition, the present invention provides, according to a twenty-third embodiment of the present invention, an optical semiconductor device comprising an optical semiconductor element sealed by using the liquid thermosetting epoxy resin composition according to the sixteenth embodiment.

Advantages

Cured products prepared by thermosetting the liquid thermosetting epoxy resin compositions according to the present invention are optically homogenous, are free from curing failure, have a low elastic modulus in bending, a high bending strength, a high glass transition temperature and a high optical transparency and are useful for optical semiconductors. And the products have improved heat-cycle resistance.

BEST MODE FOR CARRYING OUT THE INVENTION

The liquid thermosetting epoxy resin compositions according to the present invention will be described in detail below.

From the viewpoint of processability in sealing of optical semiconductors, the thermosetting epoxy resin compositions according to the present invention are liquid and have a viscosity at 25° C. of preferably 20000 mPa·s or less and more preferably 15000 mPa·s or less. The term "liquid" used herein means being liquid at ordinary temperature (25° C.).

The liquid thermosetting epoxy resin compositions according to the present invention comprise a base resin, a curing agent (C), and a curing accelerator (D) or comprise a base resin and a curing catalyst (C'). The base resin for use in the present invention comprises a cycloaliphatic epoxy compound (A) having at least one alicyclic skeleton and two or more epoxy groups per molecule and a polyol oligomer (B) having two or more terminal hydroxyl groups.

Components (A) to (D) for use in the present invention will be described below.

[Alicyclic Epoxy Compound (A)]

The cycloaliphatic epoxy compound (A) for use in the liquid thermosetting epoxy resin compositions according to the present invention is not specifically limited as long as it contains two or more epoxy groups per molecule. The epoxy groups preferably each contain two carbon atoms constituting the alicyclic skeleton. Examples of these cycloaliphatic epoxy compounds (A) are the following compounds.

[Chemical Formula 1]

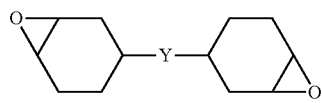

(I)

The cycloaliphatic epoxy compounds represented by Formula (I) are prepared by oxidizing corresponding alicyclic olefin compounds typically with an aliphatic percarboxylic acid. Those prepared by using a substantially anhydrous aliphatic percarboxylic acid are preferred for their high epoxidation rates (e.g., Japanese Unexamined Patent Application Publication (JP-A) No. 2002-275169).

In Formula (I), Y represents a linkage group. Examples of Y are single bond, a divalent hydrocarbon group, carbonyl group (—CO—), ether bond (—O—), ester bond (—COO—), amide bond (—CONH—), carbonate bond (—OCOO—), and a group comprising two or more of these groups combined with each other. Preferred examples of the divalent hydrocarbon group are linear or branched alkylene groups and divalent alicyclic hydrocarbon groups typified by cycloalkylene groups, each of which has eighteen or less carbon atoms. The linear or branched alkylene groups include methylene, methylmethylene, dimethylmethylene, ethylene, propylene, and trimethylene groups. The divalent alicyclic hydrocarbon groups include 1,2-cyclopentylene, 1,3-cyclopentylene, cyclopentylidene, 1,2-cyclohexylene, 1,3-cyclohexylene, 1,4-cyclohexylene, and cyclohexylidene group.

Specific examples of the compounds of Formula (I) are the following compounds.

[Chemical Formula 2]

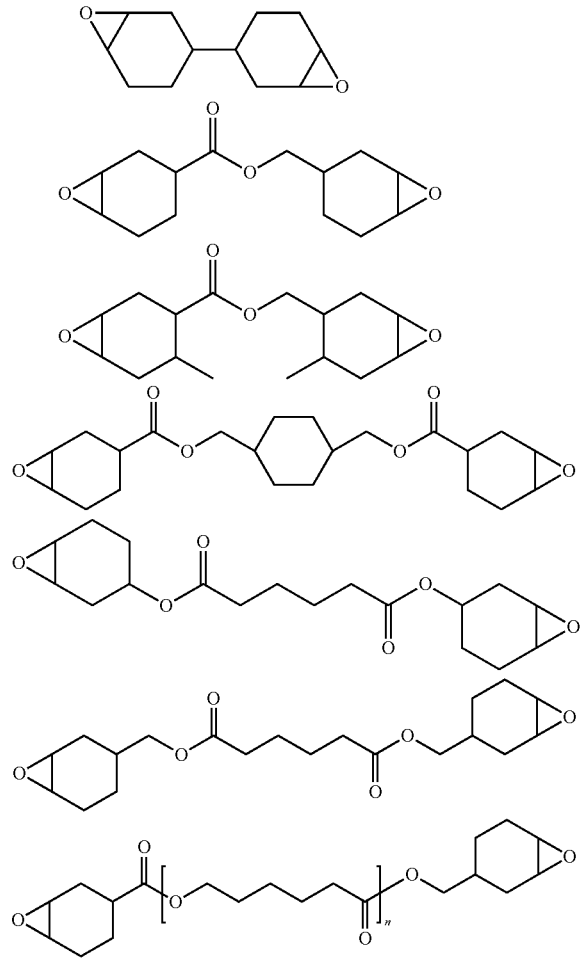

The repetition number n denotes an integer of 1 to 30.

Apart from these compounds, compounds in which one of two epoxy groups contains two carbon atoms constituting an alicyclic skeleton, such as limonene diepoxide, and glycidyl ethers whose epoxy groups do not contain carbon atoms constituting an alicyclic skeleton can also be used as the cycloaliphatic epoxy compound as Component (A) in the present invention. Specific examples of such compounds are as follows.

[Chemical Formula 3]

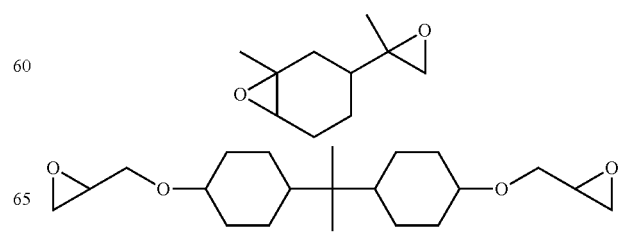

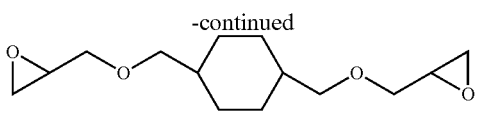

Polyfunctional epoxy compounds each having three or more epoxy groups can also be used as Component (A).

The amount of the cycloaliphatic epoxy compound as Component (A) is preferably 95 to 50 parts by weight, more preferably 90 to 55 parts by weight, and further more preferably 80 to 60 parts by weight based on 100 parts by weight of the total of Component (A) and after-mentioned Component (B). If the amount of the cycloaliphatic epoxy compound (A) exceeds 95 parts by weight, the effects of addition of Component (B) may not be exerted. In contrast, if it is less than 50 parts by weight, the heat resistance and optical transparency may deteriorate although the bending strength may increase.

Of cycloaliphatic epoxy compounds for use as Component (A), compounds having a low viscosity, such as low-viscosity cycloalkylene glycol diglycidyl ethers having a viscosity at 25° C. of 500 cps or less, can also play a role as a reactive diluent when used in combination with another Component (A). Examples of such cycloalkylene glycol diglycidyl ethers are cyclohexanedimethanol diglycidyl ether, cyclohexanediol diglycidyl ether, and hydrogenated bisphenol-A-based epoxy resins.

Furthermore, liquid bisphenol-A type, liquid bisphenol-F type, other glycidyl-based epoxy resins, and glycidyl amine-based epoxy resins can be used as a reactive diluent, in addition to Component (A). The amount of such a reactive diluent other than Component (A), if used, is 20 parts by weight or less and preferably 15 parts by weight or less to 100 parts by weight of the cycloaliphatic epoxy compound as Component (A). If the amount of the reactive diluent exceeds 20 parts by weight, desirable performance may not be obtained in some cases.

The cycloaliphatic epoxy compound for use as Component (A) is preferably liquid, from the viewpoint of better workability in preparation and casting. However, even an epoxy compound which is solid as single substance can be used as long as the resulting thermosetting epoxy resin composition containing the epoxy compound and other components shows a viscosity of 20000 mPa·s or less at 25° C. This is also true for the other epoxy compounds than Component (A). Examples of usable solid epoxy compounds are solid bisphenol-based epoxy compounds, novolak-based epoxy compounds, glycidyl esters, triglycidyl isocyanurate, and EHPE-3150 [an epoxidized cyclohexane polyether available from Daicel Chemical Industries, Ltd.]. Each of these solid epoxy compounds can be used alone or in combination. The amount of the solid epoxy compounds should be such that the resulting thermosetting epoxy resin composition has a viscosity at 25° C. of 20000 mPa·s or less.

[Polyol Oligomer (B)]

Component (B) in the present invention will be described. Component (B) for use herein is a polyol oligomer having two or more terminal hydroxyl groups in the molecule. The hydroxyl groups can be any of alcoholic hydroxyl groups and phenolic hydroxyl groups. Component (B) is not specifically limited as long as it can form a liquid thermosetting epoxy resin composition when compounded with Component (A) and other components. Component (B) itself is preferably liquid. The number-average molecular weight of the polyol oligomer (B) is preferably 200 to 10000, more preferably 300 to 5000, and further more preferably 400 to 4000. If the molecular weight is less than 200, a low elastic modulus and a high bending strength may not effectively be achieved. If it exceeds 10000, the polyol oligomer (B) may not be liquid at ordinary temperature (25° C.). The amount of the polyol oligomer (B) is preferably 5 to 50 parts by weight, more preferably 10 to 45 parts by weight, and further more preferably 20 to 40 parts by weight based on 100 parts by weight of the total amount of Components (A) and (B). If the amount of Component (B) exceeds 50 parts by weight, the heat resistance and/or the optical transparency may deteriorate although the bending strength increases. In contrast, if it is less than 5 parts by weight, the effects of addition of Component (B) may decrease.

The polyol oligomers (B) for use in the present invention are not specifically limited, but preferred examples thereof are polyol oligomers (B-1) each having an ester skeleton in the molecule and polyol oligomers (B-2) each having a carbonate skeleton in the molecule. The polyol oligomer (B) can comprise any of linear polyols and branched-chain polyols. For example, it can comprise two or more linear or branched-chain polyols and can comprise at least one linear polyol and at least one branched-chain polyol.

The polyester polyol oligomer (B-1) having an ester skeleton in the molecule, if used as Component (B), is synthetically prepared typically by transesterification or ring-opening polymerization of lactone, as in the production of regular polyester polyols. Polyols for the preparation of the polyester polyol oligomers (B-1) include ethylene glycol, diethylene glycol, 1,3-propanediol, 1,4-butanediol, 1,3-butanediol, 2,3-butanediol, 1,5-pentanediol, 3-methyl-1,5-pentanediol, 1,6-hexanediol, 2,6-hexanediol, 1,4-cyclohexanedimethanol, 1,12-dodecanediol, polybutadienediol, neopentyl glycol, tetramethylene glycol, propylene glycol, dipropylene glycol, glycerol, trimethylolpropane, 1,3-dihydroxyacetone, hexylene glycol, 1,2,6-hexanetriol, ditrimethylolpropane, and pentaerythritol. Examples of carboxylic acids for use herein are oxalic acid, adipic acid, sebacic acid, fumaric acid, malonic acid, succinic acid, glutaric acid, azelaic acid, citric acid, 2,6-naphthalenedicarboxylic acid, phthalic acid, isophthalic acid, terephthalic acid, citraconic acid, 1,10-decanedicarboxylic acid, methylhexahydrophthalic anhydride, hexahydrophthalic anhydride, methyltetrahydrophthalic anhydride, tetrahydrophthalic anhydride, pyromellitic anhydride, trimellitic anhydride, lactic acid, malic acid, glycolic acid, dimethylolpropionic acid, and dimethylolbutanoic acid. Lactones for the ring-opening polymerizations include ε-caprolactone, δ-valerolactone, and γ-butyrolactone.

Commercially available products of these polyester polyols include PLACCEL 205U, L 205AL, L 208AL, L 212AL, L 220AL, L 230AL, 220ED, 220EC, 220EB, 303, 305, 308, 312, L 312AL, 320, L 320AL, 410, 410D, P 3403, E 227, DC 2009, DC 2016, and DC 2209 each of which is available from Daicel Chemical Industries, Ltd.

The polyol oligomer (B-2) having a carbonate skeleton, if used as Component (B), is synthetically prepared by a phosgene process as in the production of regular carbonate polyols, or by a transcarbonation using a dialkyl carbonate, such as dimethyl carbonate or diethyl carbonate, or diphenyl carbonate (e.g., JP-A No. 62-187725, JP-A No. 02-175721, JP-A No. 02-49025, JP-A No. 03-220233, and JP-A No. 03-252420). The carbonate bonds are resistant to thermal decomposition, and a cured resinous product derived from a composition containing Component (B-2) has excellent stability even at high temperatures and high humidity.

Examples of polyols used in combination with dialkyl carbonates in transcarbonation are 1,6-hexanediol, ethylene glycol, diethylene glycol, 1,3-propanediol, 1,4-butanediol, 1,3-butanediol, 2,3-butanediol, 1,5-pentanediol, 3-methyl-1, 5-pentanediol, 1,4-cyclohexanedimethanol, 1,12-dodecanediol, butadienediols, neopentyl glycol, tetramethylene glycol, propylene glycol, and dipropylene glycol.

The number-average molecular weight of the carbonate polyol oligomer, Component (B-2), is preferably 200 to 10000, more preferably 300 to 5000, and further more preferably 400 to 4000. If the molecular weight is less than 200, a low elastic modulus and a high bending strength may not effectively be achieved. If it exceeds 10000, the resulting component may not be liquid at ordinary temperature (25° C.).

Examples of commercially available products of these carbonate polyols are PLACCEL CD 205, CD 210, CD 220, CD 205PL, CD 205HL, CD 210PL, CD 210HL, CD 220PL, CD 220HL, CD 220EC, and CD 221T each of which is available from Daicel Chemical Industries, Ltd.; and UH-CARB50, UH-CARB100, UH-CARB300, UH-CARB90 (1/3), UH-CARB90 (1/1), and UH-CARB100 each of which is available from Ube Industries, Ltd.

The amount of Component (B-2) is preferably 5 to 50 parts by weight, more preferably 10 to 45 parts by weight, and further more preferably 20 to 40 parts by weight based on the total amount of Component (A) and Component (B-2). If the amount of Component (B-2) exceeds 50 parts by weight, the optical transparency may deteriorate although the bending strength may increase. In contrast, if it is less than 5 parts by weight, the effects of addition of Component (B) may decrease.

[Curing Agent (C)]

Curing agents for use as Component (C) in the present invention will be described below. The curing agent (C) can be an acid anhydride. The acid anhydride can be freely selected from among curing agents generally used for epoxy resins. The acid anhydride herein is preferably liquid at ordinary temperature, such as methyltetrahydrophthalic anhydride, methylhexahydrophthalic anhydride, dodecenylsuccinic anhydride, and methyl-endomethylenetetrahydrophthalic anhydride. Acid anhydrides solid at ordinary temperature can also be used within ranges not adversely affecting the impregnating ability of the resulting epoxy resin compositions. Examples thereof are phthalic anhydride, tetrahydrophthalic anhydride, hexahydrophthalic anhydride, and methylcyclohexenedicarboxylic anhydride. Such an acid anhydride solid at ordinary temperature, if used, is preferably used as a mixture which is liquid at ordinary temperature prepared by dissolving the solid acid anhydride in an acid anhydride liquid at ordinary temperature.

The amount of the curing agent (C) is preferably 50 to 150 parts by weight, more preferably 52 to 145 parts by weight, and further more preferably 55 to 140 parts by weight to 100 parts by weight of the total of Components (A) and (B) as the base resin. More specifically, the curing agent is preferably used in such an amount that the amount of the acid anhydride is 0.5 to 1.5 equivalents per 1 equivalent of epoxy groups in the cycloaliphatic epoxy compound (A) and any other optionally-added epoxy compounds.

[Curing Accelerator (D)]

Curing accelerators for use as Component (D) in the present invention will be described. The curing accelerator (D) is not specifically limited, as long as it is generally-used curing accelerator, but is preferably a diazabicycloundecene-based or phosphorus curing accelerator. This can be used alone or in combination with up to 50 percent by weight of another curing accelerator for epoxy resins, such as a tertiary amine or a quaternary amine. The diazabicycloundecene-based or phosphorus curing accelerator preferably occupies at least 50 percent by weight of the total amount of curing accelerators. If the amount of the diazabicycloundecene-based or phosphorus curing accelerator is less than 50 percent by weight, the resulting cured article may have a deteriorated hue. For better hue, the amount is more preferably 70 percent by weight or more.

Examples of the diazabicycloundecene-based curing accelerator are 1,8-diazabicyclo[5.4.0]undecene-7 (DBU) and salts thereof. Among them, octanoic acid salts or sulfonic acid salts of 1,8-diazabicyclo[5.4.0]undecene-7, and PX-4ET (available from Nippon Chemical Industrial Co., ltd.) are typically preferred. As the curing accelerator, the diazabicycloundecene-based curing accelerator can be used alone or in combination with up to 50 percent by weight of another curing accelerator for epoxy resins, including conventional tertiary amine-based curing accelerators and phosphorus curing accelerators such as triphenylphosphine. The amount of the curing accelerator (D) is preferably 0.05 to 5 parts by weight, more preferably 0.1 to 3 parts by weight, further more preferably 0.2 to 3 parts by weight, and most preferably 0.25 to 2.5 parts by weight, to 100 parts by weight of the total of Components (A) and (B) as the base resin. If the amount of Component (D) is less than 0.05 part by weight, the curing may not be sufficiently accelerated. If it exceeds 5 parts by weight, the cured product may have a deteriorated hue. The curing accelerator as Component (D) is a compound capable of accelerating a curing reaction when the epoxy compound is cured by the action of an acid anhydride or another curing agent.

Examples of other curing accelerators usable as Component (D) are known compounds including tertiary amines such as benzyldimethylamine and 2,4,6-tris(dimethylaminomethyl)phenol; imidazoles such as 2-ethyl-4-methylimidazole and 1-cyanoethyl-2-ethyl-4-methylimidazole; organic phosphine compounds such as triphenylphosphine; tertiary amine salts; quaternary ammonium salts; phosphonium salts; and metal salts such as tin octoate and zinc octoate.

[Curing Catalyst (C')]

Next, curing catalysts for use as Component (C') in the present invention will be described. The curing catalyst (C') can be a cationic-polymerization initiator. The cationic-polymerization initiator is an initiator that releases a substance initiating cationic polymerization as a result of heating. The amount of Component (C') is preferably 0.01 to 15 parts by weight, more preferably 0.05 to 12 parts by weight, and further more preferably 0.1 to 10 parts by weight, to 100 parts by weight of the total of Components (A) and (B) as the base resin. By using Component (C) in an amount within this range, the resulting cured product may have good heat resistance, optical transparency, and weather resistance. Examples of the cationic-polymerization initiator are aryl diazonium salts [e.g., PP-33 available from Asahi Denka Kogyo K. K.], aryl iodonium salts, arylsulfonium salts [e.g., FC-509 available from Minnesota Mining and Manufacturing Company], UVE 1014 [available from GE.], CP-66 and CP-77 [available from Asahi Denka Kogyo K. K.], SI-60L, SI-80L, SI-100L, and SI-110L [available from Sanshin Chemical Industry Co., Ltd.], and allene-ion complexes [e.g., CG-24-61 available from Ciba Geigy Ltd.].

In addition, a combination of a silanol or a phenol with a chelate compound between a metal such as aluminum or titanium and an acetoacetic ester or a diketone can also be used as the curing catalyst (C'). Examples of the chelate compound are tris(acetylacetonato)aluminum and tris(ethyl acetoacetato)aluminum. The silanol or phenol includes triphenylsilanol and bisphenol-S.

[Additives]

Where necessary, the liquid thermosetting epoxy resin compositions according to the present invention may further comprise a low molecular weight compound having one or more hydroxyl groups so that the reaction can proceed mildly. The low molecular weight compound having one or more hydroxyl groups includes ethylene glycol, diethylene glycol, and glycerol. The additive just mentioned above is a low molecular weight substance and differs from the liquid polyol oligomer (B) in the present invention.

In addition, the liquid thermosetting epoxy resin compositions may further comprise various additives within ranges not adversely affecting the viscosity, the optical transparency, and other properties. Examples of such additives are silicone-based or fluorine-based antifoaming agents; silane coupling agents such as γ-glycidoxypropyltrimethoxysilane; fillers; flame-retardants; and colorants. The amount of these additives is 5 percent by weight or less of the resin composition.

The liquid thermosetting epoxy resin compositions according to the present invention each have a high glass transition temperature, a high optical transparency and a low percentage of water absorption and are preferably used for sealing optical semiconductors and other articles, for bonding electronic parts, and as sheets and sealers for liquid crystal panels. They are typically preferably used as resin compositions for sealing optical semiconductors.

The liquid thermosetting epoxy resin compositions can be cured by heating to yield cured resinous products. If active energy rays such as ultraviolet rays are used for curing, the resulting cured product may have a difference in curing between its surface layer and inner layer, may cause troubles such as wrinkles and thereby have deteriorated productivity.

The cured resinous products according to the present invention each have a glass transition temperature of preferably 110° C. to 195° C. and more preferably 120° C. to 185° C.

The elastic modulus in bending of the cured resinous products is preferably 1700 to 2800 MPa and more preferably 1800 to 2750 MPa. The bending strength thereof is preferably 50 to 100 MPa and more preferably 60 to 95 MPa. If the bending strength is less than 50 MPa, the cured resinous product may deform even by a low stress applied during its processing and usage to thereby break an element sealed by using the cured resinous product.

The cured resinous products according to the present invention are preferably optically homogenous. The term "optically homogenous" means, for example, that a cured resinous product in question has a homogenous refractive index therein. Such optical homogeneity can be confirmed by a high transmittance to light and by light scattering. The optical homogeneity can be achieved, for example, by homogenous curing of the cured resinous product.

The cured resinous products each have a transmittance to light at a wavelength of 380 nm of preferably 70 T % or more and more preferably 75 T % or more. They each have a transmittance to light at a wavelength of 400 nm of preferably 78 T % or more and more preferably 81 T % or more. If the transmittance is less than the above-mentioned ranges, an optical semiconductor element sealed by the cured resinous product may have a decreased light emission efficiency and low performance.

The percentage of water absorption of the cured resinous products is preferably 0.1% to 0.8% and more preferably 0.2% to 0.7%. If the percentage of water absorption exceeds 0.8%, package cracking may occur during process for mounting a package of semiconductor.

The optical semiconductor devices according to the present invention each comprise an optical semiconductor element sealed by using the liquid thermosetting epoxy resin compositions according to the present invention.

According to the present invention, the base resin is preferably used in combination with a curing agent and a curing accelerator or with a curing catalyst so as to yield excellent liquid thermosetting epoxy resin compositions. The base resin (a mixture of Component (A) and Component (B)) can also be used alone as a liquid epoxy resin composition. In this case, the liquid epoxy resin composition can be advantageously used typically for thermosetting resin compositions and active energy ray-curable resin compositions and so on.

The liquid thermosetting epoxy resin compositions according to the present invention can be prepared according to a conventional procedure. They can be prepared, for example, by blending predetermined amounts of Components (A), (B), (C), and (D) or Components (A), (B), and (C'), and optionally used additives and other components with heating in vacuo while eliminating bubbles. The blending is preferably carried out at a set temperature of 10° C. to 60° C. If the set temperature in preparation is lower than 10° C., the components may show an excessively high viscosity to disturb homogenous blending of the components. In contrast, if it is higher than 60° C., a curing reaction may occur and a normal liquid thermosetting epoxy resin composition may not be obtained. The blending can be carried out, for example, for about 10 minutes by using a general-purpose apparatus such as single-screw or multi-screw extruder, kneader, or dissolver each having a pressure reduction unit.

The prepared liquid thermosetting epoxy resin compositions are poured into a predetermined mold and are heated and cured under set conditions so as typically to seal optical semiconductors.

The liquid thermosetting epoxy resin compositions according to the present invention can be cured at temperatures of 100° C. to 200° C., preferably 100° C. to 190° C., and furthermore preferably 100° C. to 180° C. for a curing time of 30 to 600 minutes, preferably 45 to 540 minutes, and further more preferably 60 to 480 minutes.

If the curing temperature and curing time are lower than (shorter than) the above-specified ranges, the curing may proceed insufficiently. In contrast, if they exceeds the above-specified ranges, the resin composition may decompose. The curing conditions can be appropriately adjusted according to various factors. For example, if the curing temperature is high, the curing time is preferably set short. If the curing temperature is low, the curing time is preferably set long.

EXAMPLES

The present invention will be illustrated in further detail with reference to several examples below which by no means limit the scope of the present invention. The physical properties of cured products prepared from liquid thermosetting epoxy resin compositions according to the examples and comparative examples were determined by the following methods.

[Heat Resistance]

Thermosetting epoxy resin compositions prepared in the following examples and comparative examples were cured by heating at 110° C. for 2 hours and at 180° C. for further 2 hours to thereby yield test pieces 10 mm long, 5 mm wide and 5 mm thick. For Examples 7 and 8 and Comparative Example 2, the heating was carried out at 100° C. for one hour and at 160° C. for further 3 hours. The glass transition temperatures (Tg, ° C.) of the test pieces were measured using a thermomechanical analyzer (TMA) (a product of Seiko Instruments Inc.). The measured glass transition temperatures were used as indices for heat resistance.

[Optical Transparency]

Test pieces 3 mm thick were prepared by preparing cured products under the same conditions for test pieces for the heat resistance test. The transmittances (percent transmission) of the test pieces to light at wavelengths of 380 nm and 400 nm were determined using a spectrophotometer [trade name: UV-2450, a product of Shimadzu Corporation]. The measured transmittances were used as indices of optical transparency.

[Bending Strength Test (Elastic Modulus in Bending and Bending Strength)]

Test pieces for the bending strength test were prepared by preparing cured products under the same conditions for test pieces for the heat resistance test and processing them into pieces of 5 mm×10 mm×80 mm. The bending strength test was carried out at a bending rate of 1 mm/min in accordance with Japanese Industrial Standards (JIS) K 6911.

[Water Absorption Test]

Cured resins as test pieces were prepared in the same manner as above. The test pieces were left in water at 23° C. for 24 hours in accordance with JIS K 6991, and the percentage of water absorption was determined from the difference in weight between before and after test.

Example 1

Materials used were 80 parts by weight of 3,4-epoxycyclohexylmethyl-3',4'-epoxycyclohexanecarboxylate (a product of Daicel Chemical Industries, Ltd. under the trade name of "CELLOXIDE 2021P", cycloaliphatic epoxy resin, liquid (25° C.), epoxy equivalent: 134) as Component (A) and 20 parts by weight of a polycarbonate diol comprising 1,6-hexanediol as one of its polyol component (a product of Daicel Chemical Industries, Ltd. under the trade name of "PLACCEL CD 205PL", liquid (25° C.), number-average molecular weight: 500) as Component (B) both as the base resin; 103.4 parts by weight of methylhexahydrophthalic anhydride (a product of New Japan Chemical Co., Ltd. under the trade name of "Rikacid MH-700") as Component (C); 0.5 part by weight of octanoic acid salt of 1,8-diazabicyclo[5.4.0]undecene-7 (a product of SAN-APRO LIMITED under the trade name of "U-CAT SA-102") as Component (D); and 1.1 parts by weight of ethylene glycol (Wako Pure Chemical Industries, Ltd.).

These materials were admixed with stirring at room temperature for 20 minutes using a hybrid defoaming mixer "AWATORIRENTARO", a product of THINKY Corporation, to thereby yield a liquid thermosetting epoxy resin composition.

The prepared liquid thermosetting epoxy resin composition was cured by heating under the above-mentioned conditions, and the physical properties were determined by the above methods. The resulting cured resinous product was found to have a glass transition temperature of 173° C., a light transmittance (400 nm) of 86.7 T %, a light transmittance (380 nm) of 82.2 T %, an elastic modulus in bending of 2705 MPa, a bending strength of 70.2 MPa, and a percentage of water absorption of 0.38% and to be excellent in properties such as heat resistance, optical transparency, and bending properties.

Example 2

A liquid thermosetting epoxy resin composition was prepared by the procedure of Example 1, except for using a polycarbonate diol comprising 1,6-hexanediol as one of its polyol component (a product of Daicel Chemical Industries, Ltd. under the trade name of "PLACCEL CD 210PL", liquid (25° C.), number-average molecular weight: 1000) as Component (B); using 70 parts by weight of Component (A), 30 parts by weight of Component (B), 87.6 parts by weight of Component (C), and 0.45 part by weight of Component (D); and not using ethylene glycol.

The prepared liquid thermosetting epoxy resin composition was cured by heating under the above-mentioned conditions and the physical properties of the cured product were determined. The resulting cured resinous product was found to have a glass transition temperature of 181° C., a light transmittance (400 nm) of 84.7 T %, a light transmittance (380 nm) of 78.9 T %, an elastic modulus in bending of 2505 MPa, a bending strength of 76.8 MPa, and a percentage of water absorption of 0.41% and to be excellent in properties such as heat resistance, optical transparency, and bending properties.

Example 3

A liquid thermosetting epoxy resin composition was prepared by the procedure of Example 1, except for using a polycarbonate diol comprising 1,6-hexanediol as one of its polyol component (a product of Daicel Chemical Industries, Ltd. under the trade name of "PLACCEL CD 220HL", liquid (25° C.), number-average molecular weight: 2000) as Component (B); using 75 parts by weight of Component (A), 25 parts by weight of Component (B), 96.2 parts by weight of Component (C), and 0.48 part by weight of Component (D); and not using ethylene glycol.

The prepared liquid thermosetting epoxy resin composition was cured by heating under the above-mentioned conditions and the physical properties of the cured product were determined. The resulting cured resinous product was found to have a glass transition temperature of 183° C., a light transmittance (400 nm) of 86.8 T %, a light transmittance (380 nm) of 80.5 T %, an elastic modulus in bending of 2610 MPa, a bending strength of 71.2 MPa, and a percentage of water absorption of 0.36% and to be excellent in properties such as heat resistance, optical transparency, and bending properties.

Example 4

A liquid thermosetting epoxy resin composition was prepared by the procedure of Example 1, except for using a polycarbonate diol comprising 1,6-hexanediol as one of its polyol component (a product of Daicel Chemical Industries, Ltd. under the trade name of "PLACCEL CD 220EC", liquid (25° C.), number-average molecular weight: 2000) as Component (B); and using 85 parts by weight of Component (A), 15 parts by weight of Component (B), 105.7 parts by weight of Component (C), 0.53 part by weight of Component (D), and 1.07 parts by weight of ethylene glycol.

The prepared liquid thermosetting epoxy resin composition was cured by heating under the above-mentioned conditions and the physical properties of the cured product were determined. The resulting cured resinous product was found to have a glass transition temperature of 151° C., a light transmittance (400 nm) of 86.6 T %, a light transmittance (380 nm) of 82.1 T %, an elastic modulus in bending of 2720 MPa, a bending strength of 62.8 MPa, and a percentage of water absorption of 0.45% and to be excellent in properties such as heat resistance, optical transparency, and bending properties.

Example 5

A liquid thermosetting epoxy resin composition was prepared by the procedure of Example 1, except for using a polycarbonate diol comprising 1,6-hexanediol as one of its polyol component (a product of Daicel Chemical Industries, Ltd. under the trade name of "PLACCEL CD 220PL", liquid (25° C.), number-average molecular weight: 2000) as Component (B); using 60 parts by weight of Component (A), 40 parts by weight of Component (B), 78.2 parts by weight of Component (C), and 0.4 part by weight of Component (D); and not using ethylene glycol.

The prepared liquid thermosetting epoxy resin composition was cured by heating under the above-mentioned conditions and the physical properties of the cured product were determined. The resulting cured resinous product was found to have a glass transition temperature of 128° C., a light transmittance (400 nm) of 85.5 T %, a light transmittance (380 nm) of 79.4 T %, an elastic modulus in bending of 1875 MPa, a bending strength of 82.5 MPa, and a percentage of water absorption of 0.39% and to be excellent in properties such as heat resistance, optical transparency, and bending properties.

Example 6

A liquid thermosetting epoxy resin composition was prepared by the procedure of Example 1, except for using a polycarbonate diol comprising 1,6-hexanediol as one of its polyol component (a product of Daicel Chemical Industries, Ltd. under the trade name of "PLACCEL CD 230HL", liquid (25° C.), number-average molecular weight: 3000) as Component (B); using 70 parts by weight of Component (A), 30 parts by weight of Component (B), 85.9 parts by weight of Component (C), and 0.45 part by weight of Component (D); and not using ethylene glycol.

The prepared liquid thermosetting epoxy resin composition was cured by heating under the above-mentioned conditions and the physical properties of the cured product were determined. The resulting cured resinous product was found to have a glass transition temperature of 149° C., a light transmittance (400 nm) of 85.9 T %, a light transmittance (380 nm) of 81.9 T %, an elastic modulus in bending of 2220 MPa, a bending strength of 91.2 MPa, and a percentage of water absorption of 0.29% and to be excellent in properties such as heat resistance, optical transparency, and bending properties.

Example 7

Materials used were 60 parts by weight of 3,4-epoxycyclohexylmethyl-3',4'-epoxycyclohexanecarboxylate (a product of Daicel Chemical Industries, Ltd. under the trade name of "CELLOXIDE 2021P") as Component (A) and 40 parts by weight of a polycarbonate diol (a product of Daicel Chemical Industries, Ltd. under the trade name of "PLACCEL CD 220PL") as Component (B), both as the base resin; and 0.5 part by weight of an aromatic sulfonium salt cationic-polymerization initiator (a product of Sanshin Chemical Industry Co., Ltd. under the trade name of "San-Aid SI-100L") as Component (C').

These materials were admixed with stirring at room temperature for 20 minutes using a hybrid defoaming mixer "AWATORIRENTARO", a product of THINKY Corporation, to thereby yield a liquid thermosetting epoxy resin composition.

The prepared liquid thermosetting epoxy resin composition was cured by heating under the above-mentioned conditions and the physical properties of the cured product were determined. The resulting cured resinous product was found to have a glass transition temperature of 148° C., a light transmittance (400 nm) of 81.1 T %, a light transmittance (380 nm) of 78.9 T %, an elastic modulus in bending of 2310 MPa, a bending strength of 80.9 MPa, and a percentage of water absorption of 0.40% and to be excellent in properties such as heat resistance, optical transparency, and bending properties.

Example 8

Materials used were 90 parts by weight of a cycloaliphatic epoxy resin of the following formula (a product of Daicel Chemical Industries, Ltd. under the name of "B0018", epoxy equivalent: 201.2) as Component (A) and 10 parts by weight of a polycarbonate diol (a product of Daicel Chemical Industries, Ltd. under the trade name of "PLACCEL CD 220PL") as Component (B), both as the base resin; 75.6 parts by weight of methylhexahydrophthalic anhydride (a product of New Japan Chemical Co., Ltd. under the trade name of "Rikacid MH-700") as Component (C); and 0.40 part by weight of octanoic acid salt of 1,8-diazabicyclo[5.4.0]undecene-7 (a product of SAN-APRO LIMITED under the trade name of "U-CAT SA-102") as Component (D).

These materials were admixed with stirring at room temperature for 20 minutes using a hybrid defoaming mixer "AWATORIRENTARO", a product of THINKY Corporation, to thereby yield a liquid thermosetting epoxy resin composition.

The prepared liquid thermosetting epoxy resin composition was cured by heating under the above-mentioned conditions and the physical properties of the cured product were determined. The resulting cured resinous product was found to have a glass transition temperature of 158° C., a light transmittance (400 nm) of 83.5 T %, a light transmittance (380 nm) of 77.0 T %, an elastic modulus in bending of 2320 MPa, a bending strength of 81.6 MPa, and a percentage of water absorption of 0.36% and to be excellent in properties such as heat resistance, optical transparency, and bending properties.

[Chemical Formula 4]

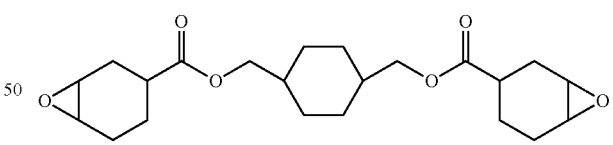

Example 9

Materials used were 80 parts by weight of the same cycloaliphatic epoxy resin as in Example 8 as Component (A) and 20 parts by weight of a polycarbonate diol (a product of Daicel Chemical Industries, Ltd. under the trade name of "PLACCEL CD 220HL") as Component (B), both as the base resin; and 0.6 part by weight of an aromatic sulfonium salt-based cationic-polymerization initiator (a product of Sanshin Chemical Industry Co., Ltd. under the trade name of "San-Aid SI-100L") as Component (C').

These materials were admixed with stirring at room temperature for 20 minutes using a hybrid defoaming mixer "AWATORIRENTARO", a product of THINKY Corporation, to thereby yield a liquid thermosetting epoxy resin composition.

The prepared liquid thermosetting epoxy resin composition was cured by heating under the above-mentioned conditions and the physical properties of the cured product were determined. The resulting cured resinous product was found to have a glass transition temperature of 151° C., a light transmittance (400 nm) of 81.2 T %, a light transmittance (380 nm) of 77.6 T %, an elastic modulus in bending of 2290 MPa, a bending strength of 82.1 MPa, and a percentage of water absorption of 0.44% and to be excellent in properties such as heat resistance, optical transparency, and bending properties.

Example 10

Materials used were 60 parts by weight of 3,4-epoxycyclohexylmethyl-3',4'-epoxycyclohexanecarboxylate (a product of Daicel Chemical Industries, Ltd. under the trade name of "CELLOXIDE 2021P") as Component (A) and 40 parts by weight of a polycaprolactonediol (a product of Daicel Chemical Industries, Ltd. under the trade name of "PLACCEL 205H", liquid (25° C.), number-average molecular weight: 530) as Component (B), both as the base resin; 61.9 parts by weight of methylhexahydrophthalic anhydride (a product of New Japan Chemical Co., Ltd. under the trade name of "Rikacid MH-700") as Component (C); and 0.3 part by weight of a special amine-based curing accelerator (a product of SAN-APRO LIMITED under the trade name of "U-CAT 18X") as Component (D).

These materials were admixed with stirring at room temperature for 20 minutes using a hybrid defoaming mixer "AWATORIRENTARO", a product of THINKY Corporation, to thereby yield a liquid thermosetting epoxy resin composition.

The prepared liquid thermosetting epoxy resin composition was cured by heating under the above-mentioned conditions and the physical properties of the cured product were determined. The resulting cured resinous product was found to have a glass transition temperature of 171° C., a light transmittance (400 nm) of 84.2 T %, a light transmittance (380 nm) of 80.1 T %, an elastic modulus in bending of 2620 MPa, a bending strength of 72.2 MPa, and a percentage of water absorption of 0.33% and to be excellent in properties such as heat resistance, optical transparency, and bending properties.

Example 11

Materials used were 65 parts by weight of 3,4-epoxycyclohexylmethyl-3',4'-epoxycyclohexanecarboxylate (a product of Daicel Chemical Industries, Ltd. under the trade name of "CELLOXIDE 2021P") as Component (A) and 35 parts by weight of a polycaprolactonediol (a product of Daicel Chemical Industries, Ltd. under the trade name of "PLACCEL 210H", number-average molecular weight: 1000) as Component (B), both as the base resin; and 0.5 part by weight of an aromatic sulfonium salt-based cationic-polymerization initiator (a product of Sanshin Chemical Industry Co., Ltd. under the trade name of "San-Aid SI-100L") as Component (C').

These materials were admixed with stirring at room temperature for 20 minutes using a hybrid defoaming mixer "AWATORIRENTARO", a product of THINKY Corporation, to thereby yield a liquid thermosetting epoxy resin composition.

The prepared liquid thermosetting epoxy resin composition was cured by heating under the above-mentioned conditions and the physical properties of the cured product were determined. The resulting cured resinous product was found to have a glass transition temperature of 152° C., a light transmittance (400 nm) of 84.1 T %, a light transmittance (380 nm) of 77.9 T %, an elastic modulus in bending of 2360 MPa, a bending strength of 75.6 MPa, and a percentage of water absorption of 0.31% and to be excellent in properties such as heat resistance, optical transparency, and bending properties.

Example 12

Materials used were 80 parts by weight of 3,4-epoxycyclohexylmethyl-3',4'-epoxycyclohexanecarboxylate (a product of Daicel Chemical Industries, Ltd. under the trade name of "CELLOXIDE 2021P") as Component (A) and 20 parts by weight of a polycaprolactonediol (a product of Daicel Chemical Industries, Ltd. under the trade name of "PLACCEL 205H") as Component (B), both as the base resin; 72.3 parts by weight of methylhexahydrophthalic anhydride (a product of New Japan Chemical Co., Ltd. under the trade name of "Rikacid MH-700") as Component (C); 0.35 part by weight of tetrabutylammonium bromide (Wako Pure Chemical Industries, Ltd.) as Component (D); and, in addition, 0.36 part by weight of ethylene glycol (Wako Pure Chemical Industries, Ltd.).

These materials were admixed with stirring at room temperature for 20 minutes using a hybrid defoaming mixer "AWATORIRENTARO", a product of THINKY Corporation, to thereby yield a liquid thermosetting epoxy resin composition.

The prepared liquid thermosetting epoxy resin composition was cured by heating under the above-mentioned conditions and the physical properties of the cured product were determined. The resulting cured resinous product was found to have a glass transition temperature of 189° C., a light transmittance (400 nm) of 85.5 T %, a light transmittance (380 nm) of 81.3 T %, an elastic modulus in bending of 2700 MPa, a bending strength of 69.6 MPa, and a percentage of water absorption of 0.35% and to be excellent in properties such as heat resistance, optical transparency, and bending properties.

Example 13

A liquid thermosetting epoxy resin composition was prepared by the procedure of Example 12, except for using a polycaprolactonediol (a product of Daicel Chemical Industries, Ltd. under the trade name of "PLACCEL L 212AL", liquid (25° C.), number-average molecular weight: 1250) as Component (B), and using 80 parts by weight of Component (A), 20 parts by weight of Component (B), 103.3 parts by weight of Component (C), 0.52 part by weight of Component (D), and 0.52 part by weight of ethylene glycol.

The prepared liquid thermosetting epoxy resin composition was cured by heating under the above-mentioned conditions and the physical properties of the cured product were determined. The resulting cured resinous product was found to have a glass transition temperature of 162° C., a light transmittance (400 nm) of 84.7 T %, a light transmittance (380 nm) of 82.0 T %, an elastic modulus in bending of 2580 MPa, a bending strength of 71.1 MPa, and a percentage of water absorption of 0.41% and to be excellent in properties such as heat resistance, optical transparency, and bending properties.

Example 14

Materials used were 70 parts by weight of 3,4-epoxycyclohexylmethyl-3',4'-epoxycyclohexanecarboxylate (a product of Daicel Chemical Industries, Ltd. under the trade name of "CELLOXIDE 2021P") as Component (A) and 30 parts by weight of a polycaprolactonetriol (a product of Daicel Chemical Industries, Ltd. under the trade name of "PLACCEL 303", liquid (25° C.), number-average molecular weight: 300) as Component (B), both as the base resin; 58.8 parts by weight of methylhexahydrophthalic anhydride (a product of New Japan Chemical Co., Ltd. under the trade name of "Rikacid MH-700") as Component (C); and 0.29 part by weight of a special amine curing accelerator (a product of SAN-APRO LIMITED under the trade name of "U-CAT 18X") as Component (D).

These materials were admixed with stirring at room temperature for 20 minutes using a hybrid defoaming mixer "AWATORIRENTARO", a product of THINKY Corporation, to thereby yield a liquid thermosetting epoxy resin composition.

The prepared liquid thermosetting epoxy resin composition was cured by heating under the above-mentioned conditions and the physical properties of the cured product were determined. The resulting cured resinous product was found to have a glass transition temperature of 170° C., a light transmittance (400 nm) of 87.1 T %, a light transmittance (380 nm) of 82.2 T %, an elastic modulus in bending of 2650 MPa, a bending strength of 75.6 MPa, and a percentage of water absorption of 0.40% and to be excellent in properties such as heat resistance, optical transparency, and bending properties.

Example 15

A liquid thermosetting epoxy resin composition was prepared by the procedure of Example 14, except for using a polycaprolactonepolyol (a product of Daicel Chemical Industries, Ltd. under the trade name of "PLACCEL 410D", number-average molecular weight: 1000) as Component (B); and using 65 parts by weight of Component (A), 35 parts by weight of Component (B), 75.6 parts by weight of Component (C), and 0.35 part by weight of Component (D).

The prepared liquid thermosetting epoxy resin composition was cured by heating under the above-mentioned conditions and the physical properties of the cured product were determined. The resulting cured resinous product was found to have a glass transition temperature of 156° C., a light transmittance (400 nm) of 85.0 T %, a light transmittance (380 nm) of 79.5 T %, an elastic modulus in bending of 2210 MPa, a bending strength of 79.6 MPa, and a percentage of water absorption of 0.44% and to be excellent in properties such as heat resistance, optical transparency, and bending properties.

Example 16

A liquid thermosetting epoxy resin composition was prepared by the procedure of Example 11, except for using a polycaprolactonetriol (a product of Daicel Chemical Industries, Ltd. under the trade name of "PLACCEL 308", number-average molecular weight: 850) as Component (B); and using 60 parts by weight of Component (A), 40 parts by weight of Component (B), and 0.5 part by weight of Component (C').

The prepared liquid thermosetting epoxy resin composition was cured by heating under the above-mentioned conditions and the physical properties of the cured product were determined. The resulting cured resinous product was found to have a glass transition temperature of 147° C., a light transmittance (400 nm) of 83.8 T %, a light transmittance (380 nm) of 77.1 T %, an elastic modulus in bending of 2180 MPa, a bending strength of 88.9 MPa, and a percentage of water absorption of 0.37% and to be excellent in properties such as heat resistance, optical transparency, and bending properties.

Comparative Example 1

Materials used were 100 parts by weight of 3,4-epoxycyclohexylmethyl-3',4'-epoxycyclohexanecarboxylate (a product of Daicel Chemical Industries, Ltd. under the trade name of "CELLOXIDE 2021P") as Component (A) as the base resin without using Component (B); 129 parts by weight of methylhexahydrophthalic anhydride (a product of New Japan Chemical Co., Ltd. under the trade name of "Rikacid MH-700") as Component (C); 0.65 part by weight of octanoic acid salt of 1,8-diazabicyclo[5.4.0]undecene-7 (a product of SAN-APRO LIMITED under the trade name of "U-CAT SA-102") as Component (D); and, in addition, 0.65 part by weight of ethylene glycol (Wako Pure Chemical Industries, Ltd.).

These materials were admixed by the procedure of Example 1 at room temperature for 20 minutes using a hybrid defoaming mixer "AWATORIRENTARO", a product of THINKY Corporation, to thereby yield a liquid thermosetting epoxy resin composition.

The prepared liquid thermosetting epoxy resin composition was cured by heating under the above-mentioned conditions and the physical properties of the cured product were determined. The resulting cured resinous product was found to have a glass transition temperature of 198° C., a light transmittance (400 nm) of 86.5 T %, a light transmittance (380 nm) of 81.4 T %, an elastic modulus in bending of 3020 MPa, a bending strength of 56.3 MPa, and a percentage of water absorption of 0.60%. The cured resinous product has an excessively high elastic modulus in bending and a low bending strength.

Comparative Example 2

Materials used were 100 parts by weight of 3,4-epoxycyclohexylmethyl-3',4'-epoxycyclohexanecarboxylate (a product of Daicel Chemical Industries, Ltd. under the trade name of "CELLOXIDE 2021P") as Component (A) as the base resin without using Component (B); and 0.5 part by weight of an aromatic sulfonium salt-based cationic-polymerization initiator (a product of Sanshin Chemical Industry Co., Ltd. under the trade name of "San-Aid SI-100L") as Component (C').

These materials were admixed by the procedure of Example 1 at room temperature for 20 minutes using a hybrid defoaming mixer "AWATORIRENTARO", a product of THINKY Corporation, to thereby yield a liquid thermosetting epoxy resin composition.

The prepared liquid thermosetting epoxy resin composition was cured by heating under the above-mentioned conditions and the physical properties of the cured product were determined. The resulting cured resinous product was found to have a glass transition temperature of 158.9° C., a light transmittance (400 nm) of 79.6 T %, a light transmittance (380 nm) of 73.4 T %, an elastic modulus in bending of 2860 MPa, a bending strength of 53.1 MPa, and a percentage of water absorption of 0.80%. The cured resinous product has an excessively high elastic modulus in bending and a low bending strength.

These results show that cured resinous products prepared from the resin compositions comprising Components (A), (B), (C), and (D) or Components (A), (B), and (C') can have a low elastic modulus and a high bending strength without reducing optical transparency (light transmittance).

Industrial Applicability

Cured products prepared by thermosetting the liquid thermosetting epoxy resin compositions according to the present invention are optically homogenous, are free from curing failure, are excellent in heat resistance, have a low elastic modulus in bending, a high bending strength, a high glass transition temperature and a high optical transparency and are useful for optical semiconductors. And the products have improved heat-cycle resistance. The liquid thermosetting epoxy resin compositions according to the present invention are preferably used for sealing optical semiconductors and other articles, for bonding electronic parts.

The invention claimed is:

1. A liquid thermosetting epoxy resin composition comprising:
    a base resin; and
    a curing catalyst (C'),
    the base resin comprising:
        a cycloaliphatic epoxy compound (A) represented by the Formula I

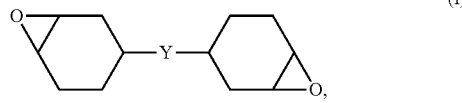

(I)

wherein Y is a divalent alicyclic hydrocarbon group; and
        a carbonate polyol oligomer (B) derived from:
            1,6-hexanediol;
            another diol component HO—R—OH, wherein R represents a linear or branched hydrocarbon group containing two to fourteen carbon atoms which may contain oxygen or a hydrocarbon group containing two to fourteen carbon atoms and having one to three cyclic structures which may contain oxygen in its ring; and a carbonate component,
        wherein the carbonate polyol has a molar ratio of 1,6-hexanediol to the other diol component of 10:1 to 2:8 and a number-average molecular weight of 300 to 3000.

2. The liquid thermosetting epoxy resin composition according to claim 1, wherein the cycloaliphatic epoxy compound (A) is a liquid cycloaliphatic epoxy compound.

3. The liquid thermosetting epoxy resin composition according to claim 1, wherein the carbonate polyol oligomer (B) is a liquid polyol oligomer.

4. The liquid thermosetting epoxy resin composition according to claim 3, comprising:
    100 parts by weight of a base resin comprising:
        95 to 50 parts by weight of the cycloaliphatic epoxy compound (A); and
        5 to 50 parts by weight of the liquid carbonate polyol oligomer; and
    0.01 to 15 parts by weight of the curing catalyst (C').

5. The liquid thermosetting epoxy resin composition according to claim 1, wherein the curing catalyst (C') is an initiator capable of releasing a substance for initiating cationic polymerization as a result of heating.

6. The liquid thermosetting epoxy resin composition according to claim 1, for sealing of optical semiconductors.

7. A cured resinous product derived from the epoxy resin composition of claim 1.

8. The cured resinous product according to claim 7, which is optically homogeneous.

9. An optical semiconductor device comprising an optical semiconductor element sealed by using the liquid thermosetting epoxy resin composition of claim 6.

10. The liquid thermosetting epoxy resin composition according to claim 5, comprising:
    100 parts by weight of a base resin comprising:
        95 to 80 parts by weight of the cycloaliphatic epoxy compound (A); and 5 to
        20 parts by weight of the carbonate polyol oligomer (B), wherein the carbonate polyol oligomer (B) is a liquid polyol oligomer.

* * * * *